United States Patent [19]

Antonovsky

[11] Patent Number: 4,560,872

[45] Date of Patent: Dec. 24, 1985

[54] METHOD AND APPARATUS FOR IMAGE FORMATION

[75] Inventor: Ariel D. Antonovsky, Moorabbin, Australia

[73] Assignee: Commonwealth Scientific and Industrial Research Organization, Campbell, Australia

[21] Appl. No.: 491,960

[22] PCT Filed: Sep. 1, 1982

[86] PCT No.: PCT/AU82/00147

§ 371 Date: May 2, 1983

§ 102(e) Date: May 2, 1983

[87] PCT Pub. No.: WO83/00921

PCT Pub. Date: Mar. 17, 1983

[30] Foreign Application Priority Data

Sep. 1, 1981 [AU] Australia ............................. PF0538

[51] Int. Cl.⁴ .......................................... H01J 37/256
[52] U.S. Cl. ................................................. 250/310
[58] Field of Search ................................ 250/310, 311

[56] References Cited

U.S. PATENT DOCUMENTS 3,628,014 12/1971 Grubic .................................. 250/310
3,812,288 5/1974 Walsh et al. ...................... 250/311 X
4,041,311 8/1977 Martin ............................... 250/310 X Primary Examiner—Alfred E. Smith
Assistant Examiner—Jack I. Berman
Attorney, Agent, or Firm—Sughrue, Mion, Zinn, Macpeak & Seas

[57] ABSTRACT

A method of forming a color image using image signals generated by a scanning electron microscope. Three different image signals are generated, a first representing a monochromatic image derived from secondary electrons of energies over a broad range of energies, a second representing a monochromatic image derived from secondary electrons having high energies only and a third representing a monochromatic image derived from backscattered electrons. The three so generated image signals are used to construct the color image by assigning respective colors of an additive primary set to the monochromatic images represented by the three signals. The image signals are combined to form the color image by a process which results in additive mixing, in the color image, of the three monochromatic images.

10 Claims, 3 Drawing Figures

METHOD AND APPARATUS FOR IMAGE FORMATION

This invention relates to a method and apparatus for image formation.

It is known to construct coloured images in which different regions of the image are coloured in accordance with a colour coding in such a fashion that variations in a physical variable are represented by different colours in the image. For example, in astronomy, images of celestial objects are frequently coloured such that regions in the image at which a physical variable such as gas velocity, radiation intensity or the like exhibits particular common characteristics, such as common magnitude, are delineated by different colours as compared to regions having other particular characteristics. Whilst such coloured images convey information in a readily assimilatable fashion, the information content is generally no greater than would be conveyable had the colours not been used and the image simply coded monochromatically such as by different shading patterns. This is in contrast to the images normally perceived by the eye in nature where, because of the additively mixed light impressions perceived, a variety of subtle lighting effects can be differentiated, which impressions can hardly be adequately represented monochromatically. This arises, of course, because a coloured image as perceived by the eye can be considered as being made up of three simultaneously perceived images each of a separate primary colour and the eye is capable of differentiating regions in the image as between which the relative proportions of the three primary colours vary. An object of this invention is to provide a method and apparatus for image formation in which fuller advantage is taken of this colour differentiating ability of the eye. Thus, the invention broadly contemplates methods and apparatus for image formation wherein three image signals are generated by detecting signals from an object representing three different characteristics of the object not being colours of the object, said image signals being used to form a colour image of the object in which the relative intensities of three image colours at each location in the image are representative of the prevailing relationship between said three characteristics at a corresponding location on said object.

According to another aspect of the present invention there is provided a method of image formation wherein a sample is scanned by use of the scanning electron microscope to cause an electron beam to be incident on a sample, and three image signals are generated by respectively detecting at least three different effects of such incidence, said image signals being used to form a colour image of said sample in which the relative intensities of three image colours at each location in the image are representative of the prevailing relationship between said three effects at a corresponding location on the said sample.

The invention still further provides apparatus for image formation comprising a scanning electron microscope having means for directing an electron beam to be incident on and scan an object, detector means for generating three image signals by respectively detecting at least three different effects of said incidence and means for generating from said image signals a colour image of said sample in which the relative intensities of three image colours at each location in the image are representative of the prevailing relationship between said three effects at a corresponding location on said sample.

In a preferred embodiment the said three effects may be effects of secondary electron (SE) emission having energies at two different respective energy bands and of emission of backscattered electrons (BSE). The three colours may represent intensities of the respective said emissions.

The actual production of the image from the image signals may be effected by using the image signals corresponding to the respective said effects each in turn to form three respective monochromatic images by use of a visual display device and combining those monochromatic images photographically such as by photographing them in succession and through respective differently coloured filters on to a single colour film. Alternatively the signals may be used for generation of a three colour image on a colour cathode ray tube or other colour visual display device.

The invention is further described with reference to the accompanying drawings in which.

Figure 1:
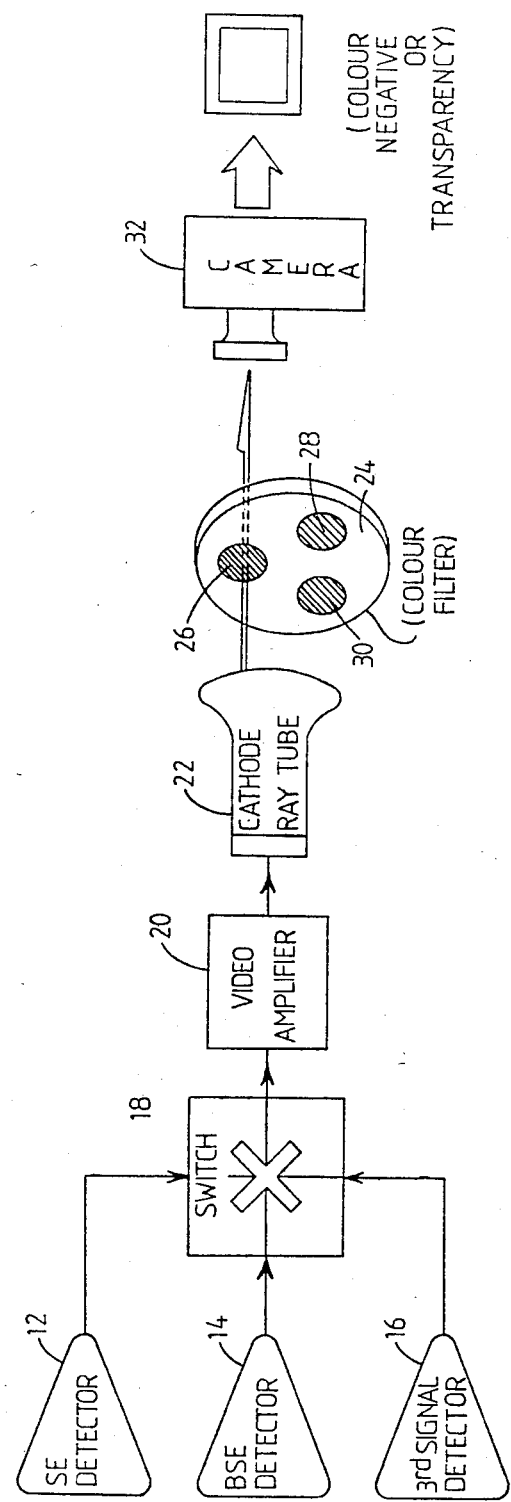
FIG. 1 is a diagram illustrating one method in accordance with the invention.

Referring now to FIG. 1, three detectors 12, 14 and 16 associated with a scanning electron microscope (not shown) are arranged to receive electron emission from a sample pursuant to incidence on the sample of the scanning beam of the electron microscope. As is customary, scanning is effected in a "raster" comprising a series of closely spaced lines. Detectors 12 and 16 are arranged to detect secondary electrons generated at the surface of the sample pursuant to such incidence whilst detector 14 is used to detect backscattered electrons.

The detectors 12, 14 and 16 may be formed in accordance with usual practice, detectors 12 and 16 having suitable electric potentials applied thereto to attract the secondary electrons. The attracting voltages are arranged to be different so that the two detectors 12 and 16 are responsive to detect secondary electrons in different energy bands, one detector 12 detecting secondary electrons in a broad energy band and the other detector 16 detecting secondary electrons in a high energy band, being a portion of the last mentioned broad energy band. The two detectors may be of similar form, detector 16 having a relatively lower collector voltage applied thereto than detector 12.

By means of a switch 18, signals produced by the three detectors, and representing the intensities of received electrons during scanning, are selectively passed to a video amplifier 20, for amplification of the detector signals and thence passed to a cathode ray tube 22 for production of a monochromatic image from the signals. The scanning of the electron beam causes the signals from each of the detectors to be in the form of successive line signals the amplitudes of which vary over the time of the corresponding scan across the sample in a fashion representing the varying intensities of received electrons along the scan path. Thus, if, for example, switch 18 is connected to receive output from detector 12, the series of successive line signals from detector 12 will be passed to the amplifier 20 and thence to cathode ray tube 22. These scan signals are amplified in the video amplifier and applied to the cathode ray tube 22 to generate corresponding scan lines on the cathode ray tube so that the aforementioned monochromatic image is built up in such a fashion that the brightness of the image at any point on a scan line is proportional to the intensity of the secondary electrons received by the detector 12. Correspondingly, when the detector 14 is switched to the amplifier 20, a different monochromatic image is built up on the cathode ray tube, this representing variations in intensity of the received backscattered electrons during scanning. Lastly, when the detector 16 is connected via switch 18 to amplifier 20, cathode ray tube 22 displays a third monochromatic image which is representative of variations in the intensity of high energy secondary electrons over the scanned sample.

Three separate scannings of the sample may be used to generate separately the three signals from the detectors 12, 14 and 16, with switch 18 being switched from detector 12 to detector 14 after the first scan and from detector 12 to detector 16 after the second scan. In this case, the three aforementioned monochromatic images thus appear in succession on the cathode ray tube 22.

A colour filter carrier 24 is positioned in front of the cathode ray tube 22. This has three colour filters 26, 28, 30 of different colours selected to form an additive colour mixing set. For example, the colours may be the primary colours red, blue and green. A camera 32 is positioned to receive an image from the cathode ray tube 20 via whichever of the filters 26, 28, 30 is for the time being interposed in front of the cathode ray tube, the filter carrier 24 being arranged to be rotatable to effect selective positioning of any desired one of the filters 26, 28, 30 in front of the cathode ray tube. By loading the camera 32 with colour film and photographing the three monochromatic images appearing in succession on the cathode ray tube 22 through respective different ones of the three filters 26, 28 and 30 there will be produced on the colour film a colour image in which the three differently coloured images resulting from interposition of the three filters are additively combined.

Figure 2:
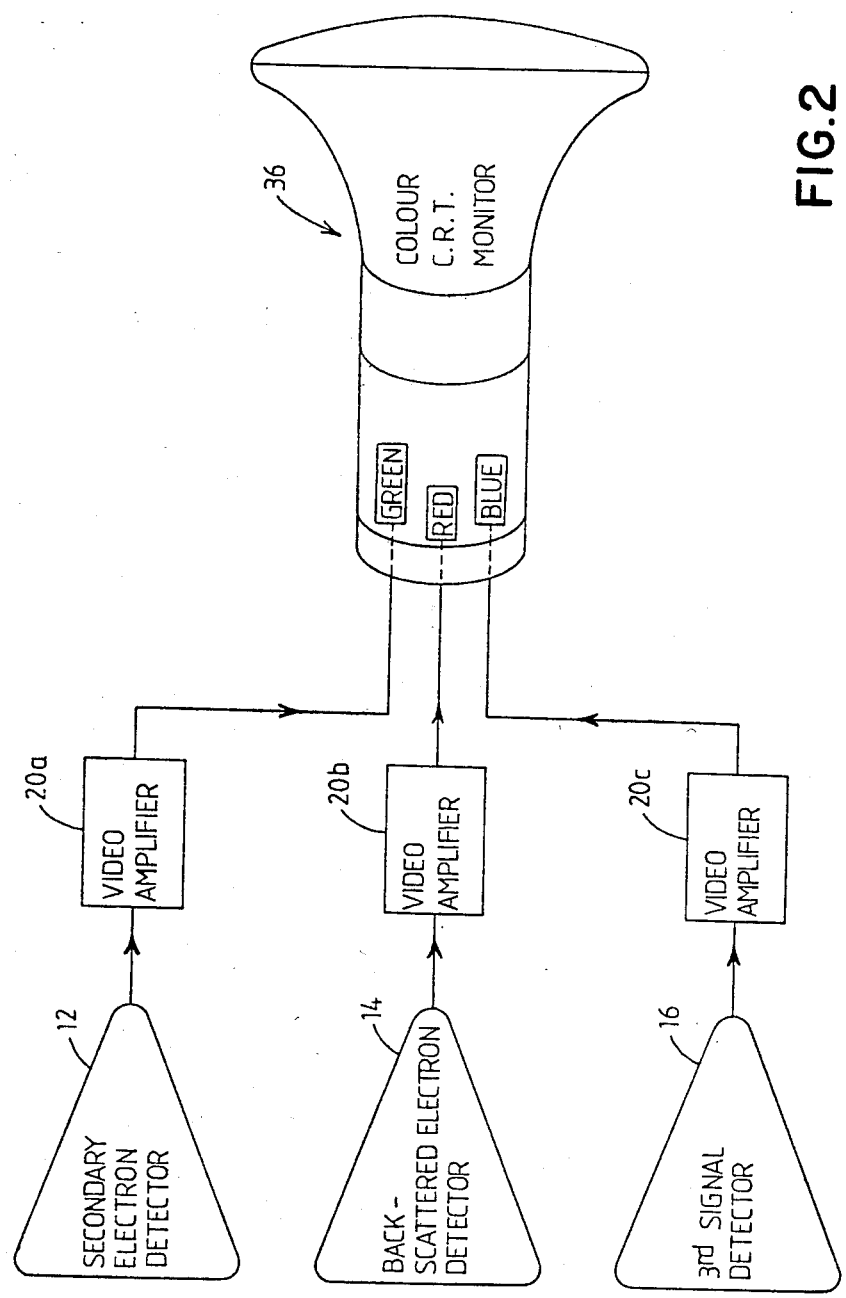
FIG. 2 is a diagram illustrating another method in accordance with the invention.

FIG. 2 shows a variation of the arrangement of FIG. 1 in which the three detectors 12, 14 and 16 are arranged to each simultaneously produce signals during scanning and in which three separate video amplifiers 20a, 20b, 20c are arranged to receive the line signals from the three detectors and to respectively control the green, red and blue guns of a colour cathode ray tube monitor 36. In the latter case, then, the cathode ray tube monitor 36 produces a colour image in which the monochromatic green, red and blue images corresponding to line signals from the detectors 12, 14 and 16 are additively combined to produce a single multicolour image.

Figure 3:
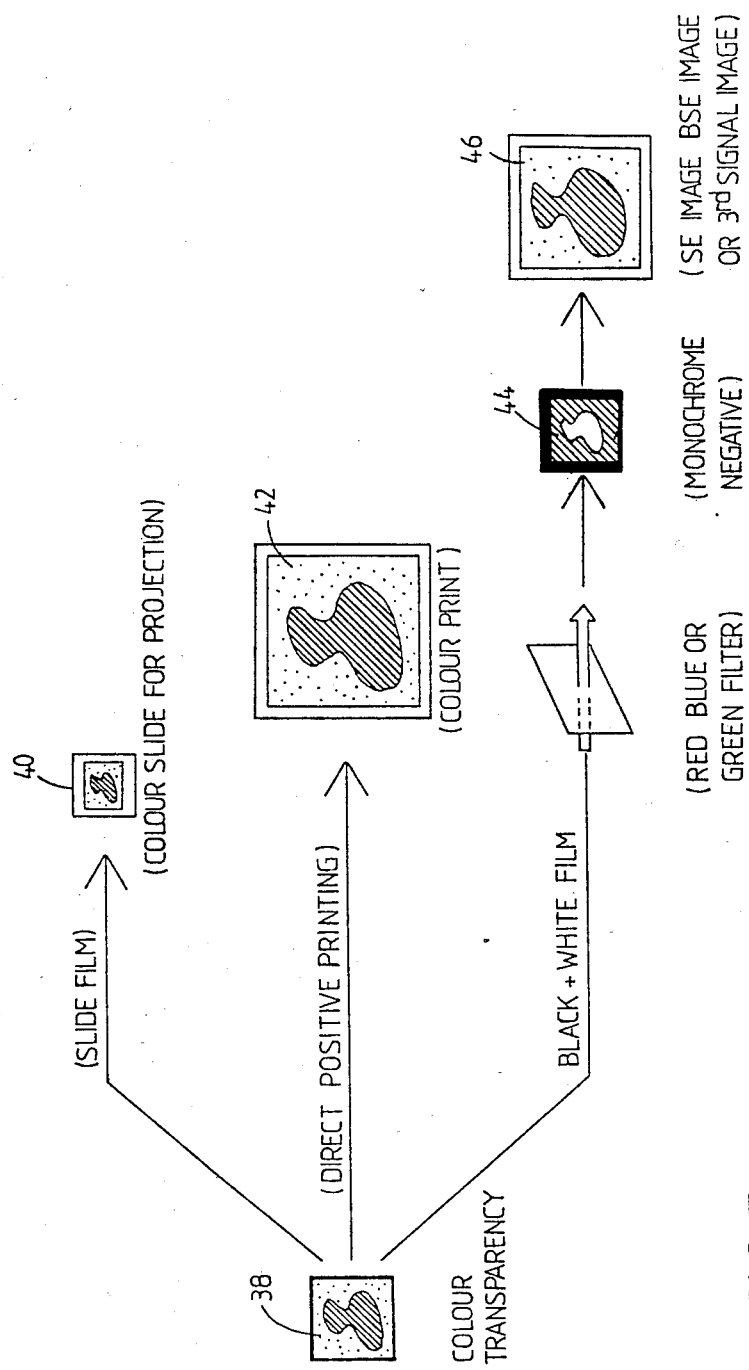
FIG. 3 is a diagram showing uses of a colour transparency when produced by the method of FIG. 1.

It is possible to load the camera 32 with colour negative material from which a print can subsequently be made, but it is preferred to load the camera 32 with colour transparency film so that a colour transparency 38 as shown in FIG. 3 is produced. From this colour transparency it is possible to produce by usual photographic techniques, a colour slide 40 suitable for projection of the colour image on the transparency 38. By direct positive printing it is also possible to produce a colour print 42 showing the image on transparency 38. Furthermore, if the image from the colour transparency 38 is projected onto a panchromatic black and white negative film material it is possible to produce monochrome negatives such as the negative 44 shown. Three different such negatives may be made, by suitable interposition of respective red, blue and green filters during each exposure. The three so produced negatives thus exhibit negative images corresponding to the respective monochromatic images originally produced at the cathode ray tube 22. By printing the negatives, then, it is possible to extract from the colour transparency 38 three black and white prints 46 showing positive images corresponding to respective ones of the three images which were originally displayed on the tube 22.

Although the choice of detected effects to be used to form the blue, green and red signals in the described arrangements is variable, we prefer to use the following colour signal regime:

Secondary Electron Image (detected by detector 12)—Green Backscattered Electron Image (detected by detector 14)—Red High Energy Secondary Electron Image (detected by detector 16)—Blue The selection of red to display the backscattered electron image is appropriate since that striking colour readily delineates fundamental differences in terms of differing atomic numbers at differing areas of the sample. These atomic number differences are readily seen in the back-scattered electron image. This has been found to be particularly useful where heavy element concentrations in the sample carry the most significance, such as when examining metallic ores in rock samples, heavy metal absorption or staining in biological samples, and alloy phases in metal samples. The secondary electron image generated from the signal from detector 12 is primarily dependent on sample topography and so tends to produce over-all colouration (particularly in the background). For this, green has been found to be more suitable than blue since combinations of red and green produce a range of "earth" colours reds, yellows, browns and greens) which are expected in biological and mineralogical specimens. The high energy secondary electron image from the signal derived from detector 16 covers the energy range between normal secondary electron and backscattered electron signals. The high energy secondary electron emission is highly directional and can be used to enhance the differentiation between the subject and the background. The image from this energy range tends to detail the "highlights" and appears blue in the colour pictures produced by the method described. Generally, these highlights appear in the red and green images as well, and the resulting "white" approximates the "white" associated with specular reflection in colour photographs made with visible light illumination.

The photographs resulting from the described processes have several advantages. They have been found to be aesthetically acceptable, to possess increased information content, as compared to monochromatic photographs, and to be simple to process.

Of great significance is believed to be the ability to introduce colour into scanning electron microscopy work in such a way as to give an appearance of realism which is inherent in the sample being examined. Although the true colours of the sample cannot be reproduced by electron illumination, the photographic means described can produce the qualities which true colours would exhibit. It will be understood that it is only through the additive colour process involving the three distinct primary colour images in accordance with the invention that this realism can be obtained. The three different signals being employed, each with a different information content, and the additional colour differentiation made possible in accordance with the invention, also greatly increase the total possible information content of the image. As described, the three information sets corresponding to the three different images can in any event be later retrieved separately by photographic means if desired.

Whilst, in the described arrangement two separate detectors for secondary electron emission have been employed, it will be apparent that except where simultaneous derivation of the three necessary image signals is required, one of the detectors 12, 16 could be omitted and the same secondary electron detector employed to derive both the broad energy band and high energy secondary electron image signals. This would be accomplished by providing means for varying the voltage in use applied to the single detector to give the high energy and broad energy band image signals on separate scans.

As mentioned, the detectors 12 and 14 as well is detector 16, if provided, may be of conventional form. More particularly, the BSE detector 14 may comprise a solid state detector having a set of four semi-conductor crystals arranged around the bottom of the microscope pole piece (between the final lens and the sample). The electrons to be sensed are scattered back from the specimen towards the crystals with energies of anywhere from several hundred volts up to the primary beam energy. Since heavier elements back-scatter electrons more efficiently than lighter ones, areas of heavy element concentration in the sample appear as bright areas in the resulting monochrome image, and red in the colour image.

The detector 12 and the detector 16, if provided, may comprise an "E-T" detector having a scintillator (a phosphorescent-coated disc) optically connected to a photo-multiplier tube via a "light guide". As secondary electrons emitted by the sample strike the scintillator disc, a light flash occurs which is converted by the photo-multiplier tube to a usable electronic signal. The intensity of flashes at each point in the scan of the sample determines the resulting image. Since the energy of the secondary electrons is fairly low (below 100 volts) a collector cage, maintained at a positive voltage, is used to attract electrons towards the scintillator. The actual voltage employed then determines the quantity and energy of electrons attracted to the detector and so, can be used to modify the final image produced. For example, in the procedure described above, the green image may be derived from a "normal" collector voltage of about 250 V and would then be representative of the full range of secondary electrons up to the lower energy back-scattered electrons. The blue image may then be derived from a low collector voltage setting of about $-20$ V, which will not attract the low energy secondary electrons. Therefore, the blue image highlights the high energy secondary electrons.

Due to overlapping energy ranges, electrons of a particular origin may be included in any or all of the three images used in the colour picture. However, this has been found to add to the blending of colours which is expected in a real colour image.

The invention may be applied to imaging systems other than those employing a scanning electron microscope. For example, it may be applied to generate images of astronomical objects from radio data. Thus, radio waves detected at three different energy bands may be utilized to generate three image signals which are combined to generate an image.

In addition to the described variant construction employing the detector 14 and one of the two detectors 12 and 16, it is also possible to employ a single detector in place of all three detectors 12, 14 and 16. Such a detector would be positioned at a location where it would be subject to incidence thereon of secondary electron emission over a broad range of energies and also to incidence thereon of backscattered electrons. The detector may then be of a kind permitting selection of the energy level of electrons to which it is responsive (such as by varying a collector potential). The necessary three image signals could then be derived by suitably varying the aforementioned energy level to which the detector is responsive. Such variation could be effected cyclically, such as by electronic means. Generally, with such a system, there will however be some loss of signal information, as compared to that derivable from the described two detector and three detector systems.

In the described method, the band of energies of secondary electrons to which detector 12 is responsive is broad enough to encompass the energies of secondary electrons to which detector 16 is responsive. However, it is not essential that this be the case. The detectors 12 and 16 may be responsive to secondary electrons of differing non-overlapping energy bands. The energy bands may, further, be continuous or discontinuous.

I claim:

1. A method of image formation wherein a sample is scanned by use of a scanning electron microscope to cause an electron microscope to cause an electron beam to be incident on the sample, and three image signals are generated by respectively detecting the intensity of secondary electron emission in a first energy band resulting from said incidence, the intensity of secondary electron emission in a second energy band resulting from said incidence, and the intensity of back-scattered electrons resulting from said incidence, said image signals being used to form a colour image of said sample in which the relative intensities of three image colours at each location in the image are repesentative of the prevailing relationship between said intensity of secondary electron emission in a first energy band, said intensity of secondary electron emission in a second energy band and said intensity of backscattered electron, at a corresponding location on the said sample.

2. A method of image formation as claimed in claim 1, wherein the image signals corresponding to the respective said intensities are used in turn to form three respective monochromatic images by use of a visual display device, those monochromatic images being combined photographically to form said colour image.

3. A method of image formation as claimed in claim 2 wherein said combining is effected by photographing said monochromatic images in succession through respective differently coloured filters onto a single colour film.

4. A method of image formation as claimed in claim 1 wherein said signals are used for formation of a three colour image on a cathode ray tube or other colour visual display device.

5. A method of image formation as claimed in claim 1 wherein said first energy band is an energy band including high energy and low energy secondary electron emission, and said second energy band is an energy band including high energy secondary electron emission but not low energy secondary electron emission.

6. A method of image formation as claimed in claim 5 wherein said three image colours are blue, green and red, the intensity of green image colour being proportional to the intensity of said secondary electron emission in said first energy band, the intensity of said blue image colour being proportional to the intensity of the secondary electron emission in said second energy band and the intensity of said red image colour being proportional to the intensity of said back-scattered electrons.

7. Apparatus for image formation comprising a scanning electron microscope having means for directing an electron beam to be incident on and scan a sample, detector means for generating three image signals by respectively detecting the intensity of secondary electron emission in a first energy band resulting from said incidence, the intensity of secondary electron emission in a second energy band resulting from said incidence and the intensity of back-scattered electrons resulting from said incidence, and means for generating from image signals a colour image of said sample in which the relative intensities of three image colours at each location in the image are representative of the prevailing relationship between said intensity of secondary electron emission in a first energy band, said intensity of secondary electron emission in a second energy band and said intensity of backscattered electrons at a corresponding location on said sample.

8. Apparatus for image formation as claimed in claim 7 including a visual display device coupled for utilizing said three image signals in turn to form three respective monochromatic images, and photographic means for photographically combining said monochromatic images to form said colour image.

9. Apparatus for image formation as claimed in claim 8 including filter means for filtering said monochromatic images by interposition of respective differently coloured filters prior to said photographic combining.

10. Apparatus for image formation as claimed in claim 7 including a colour cathode ray tube or other colour visual display device coupled to receive said three signals and to display said colour image in accordance therewith.

* * * * *